(12) United States Patent
Hauschild et al.

(10) Patent No.: US 9,007,784 B2
(45) Date of Patent: Apr. 14, 2015

(54) DEVICE FOR SELF-ALIGNING AND AFFIXING OF A MICROCHANNEL PLATE IN A MICRO-SYSTEM AND METHOD THE SAME

(75) Inventors: Jan-Peter Hauschild, Hamburg (DE); Eric Wapelhorst, Hamburg (DE); Jörg Müller, Buchholz (DE)

(73) Assignees: Bayer Intellectual Property GmbH, Monheim (DE); Krohne Messtechnik GmbH, Duisburg (DE)

( * ) Notice: Subject to any disclaimer, the term of this patent is extended or adjusted under 35 U.S.C. 154(b) by 365 days.

(21) Appl. No.: 12/865,997

(22) PCT Filed: Feb. 17, 2009

(86) PCT No.: PCT/EP2009/001088
§ 371 (c)(1),
(2), (4) Date: Aug. 3, 2010

(87) PCT Pub. No.: WO2009/109288
PCT Pub. Date: Sep. 11, 2009

(65) Prior Publication Data
US 2011/0002109 A1  Jan. 6, 2011

(30) Foreign Application Priority Data
Feb. 29, 2008 (DE) .......................... 10 2008 011 972

(51) Int. Cl.
| | |
|---|---|
| H05K 1/11 | (2006.01) |
| H05K 1/14 | (2006.01) |
| B81C 3/00 | (2006.01) |
| H01J 43/24 | (2006.01) |
| H01J 49/00 | (2006.01) |

(52) U.S. Cl.
CPC ............... *B81C 3/008* (2013.01); *H01J 43/246* (2013.01); *H01J 49/0018* (2013.01); *B81C 2203/051* (2013.01); *H01L 2924/0002* (2013.01)

(58) Field of Classification Search
USPC .......................................... 361/782–785, 803
See application file for complete search history.

(56) References Cited

U.S. PATENT DOCUMENTS

| | | | |
|---|---|---|---|
| 5,903,059 A | 5/1999 | Bertin et al. | |
| 6,627,446 B1 * | 9/2003 | Roach et al. .................... | 436/43 |

(Continued)

FOREIGN PATENT DOCUMENTS

| | | |
|---|---|---|
| EP | 1 700 821 A | 9/2006 |
| EP | 1700821 A | 9/2006 |

OTHER PUBLICATIONS

International Search Report dated Dec. 18, 2009.
ScinceDirect International Journal of Mass Spectrometry 264 (2007) 53-60 Mass spectra measured by a fully integrated MEMS mass spectrometer J.-P. Hauschild, E. Wapelhorst, J. Muller.

(Continued)

*Primary Examiner* — Tuan T Dinh
(74) *Attorney, Agent, or Firm* — Norris McLaughlin & Marcus, P.A.

(57) ABSTRACT

A device and/or method mount and affix a microchannel plate in a micro system. The device and/or method has at least one conductive spring structure, formed to accept a microchannel plate, for aligning, fixing and making electrical contact with the microchannel plate. The device and/or method also has at least one stop against which the microchannel plate is pushed or pressed when affixed by at least one conductive spring structure, wherein the at least one conductive spring structure and the at least one stop are being applied on a non-conductive substrate.

15 Claims, 3 Drawing Sheets

(56) References Cited

U.S. PATENT DOCUMENTS

| | | | |
|---|---|---|---|
| 6,709,182 B1 * | 3/2004 | De Jong | 403/12 |
| 7,095,545 B2 * | 8/2006 | Regan | 359/290 |
| 7,273,589 B2 * | 9/2007 | Stimpson et al. | 422/509 |
| 7,486,522 B2 * | 2/2009 | Muller et al. | 361/737 |
| 2005/0236935 A1 * | 10/2005 | Ohmori et al. | 310/328 |
| 2007/0087474 A1 | 4/2007 | Eklund et al. | |
| 2008/0011904 A1 * | 1/2008 | Cepollina et al. | 244/172.6 |
| 2008/0285044 A1 * | 11/2008 | Sin et al. | 356/452 |

OTHER PUBLICATIONS

A one-chip solution of a mass spectrometer J.-P. Hauschild, E. Wapelhorst, J. Muller Hamburg University of Technology, Hamburg, Germany Transducers & Eurosensors'07 the 14th Intl. Conference on Solid-State Sensors, Actoators and Microsystems, Lyon, France, Jun. 10-14, 2007.

A high-resolution, two-dimensional, electron imaging integrated circuit D G Lomas and J V Hatfield Department of Electrical Engineering and Electronics, UMIST Publication Oct. 28, 2007.

Non-English European International Search Report.

\* cited by examiner

DEVICE FOR SELF-ALIGNING AND AFFIXING OF A MICROCHANNEL PLATE IN A MICRO-SYSTEM AND METHOD THE SAME

This is an application filed under 35 USC §371 of PCT/EP2009/001088, claiming priority to DE 10 2008 011 972.5 filed on Feb. 29, 2008.

BACKGROUND OF THE INVENTION (1) Field of the Invention

The present invention is concerned generally with the field of microelectromechanical system (MEMS). The present invention relates to a fixture for use in microsystems, in particular for the self-aligning mounting and fixture of microchannel plates, and to a device at least comprising a fixture according to the invention and a microchannel plate.

(2) Description of Related Art

Microsystems engineering combines methods from microelectronics, micromechanics, microfluidics and microoptics, but also developments in informatics, biotechnology and nanotechnology, by combining developments and structures from these fields to form new systems. The dimensions of the function-determining structures lie in the micrometers range, which can be used as delimitation with respect to nanotopology.

Whereas microelectronics is restricted to electrical components such as transistors (CPU) and capacitors (RAM), microsystems engineering is concerned with the design and production of microelectronic circuits and micromechanical and microoptical components and the integration thereof to form a system both as discrete components and monolithically e.g. in semiconductor materials such as crystalline silicon or gallium arsenide.

In microsystems, also called micro electro mechanical systems (MEMS), sensors, actuators and data processing cooperate. Examples are optical sensors in cableless mouses, or bubble jet print heads of modern printers, acceleration and rate-of-rotation sensors for triggering airbags and for controlling stability and navigation systems, instruments for minimally invasive surgery, endoscope systems, chemical sensors for foodstuff monitoring, micro hard disks or micromirror actuator chips in beamers or organic light-emitting diodes. An area on the periphery of microsystems engineering is microprocess technology, which is concerned with physical and/or chemical processes that proceed in microstructured apparatuses.

Microsystems were formerly based predominantly on semiconductor electronics; the base material (substrate) was generally silicon or gallium arsenide. Nowadays, microsystems can also be produced inexpensively from plastics and the results in the field of materials research are used for multifunctional systems.

Microsystems are often not produced monolithically from a wafer, but rather comprise different components that are connected to one another to form a hybrid microsystem. The microsystem accordingly has connection locations that permit the connection of a plurality of components to form a system. One example of such a connection location is fixtures for accommodating and fixing a component of the microsystem. A micro mass spectrometer will be considered as an example for illustration purposes.

Micro mass spectrometers are known from the prior art (see e.g. "*Complex MEMS: A fully integrated TOF micro mass spectrometer*" published in *Sensors and Actuators A: Physical*, 138 (1) (2007), 22-27). It has not been possible hitherto to produce all the components of a micro mass spectrometer monolithically in one workpiece. The secondary electron multiplier is e.g. a complex component which has to be fabricated separately and be connected to the remaining components of a micro mass spectrometer to form an overall system. This requires a fixture that accommodates the secondary ion multiplier and fixes it relative to other components of the system.

The use of a microchannel plate as a secondary ion multiplier is obvious in the case of a micro mass spectrometer.

A microchannel plate is a planar, image-resolving secondary electron multiplier. It serves for the low-noise amplification of small currents of free electrons or other ionizing particles which strike the input side of the plate with a certain energy and instigate secondary electrons there.

The microchannel plate comprises two metallized plate sides between which an acceleration voltage is present. The plate itself is composed of a semiconductor and is perforated in a manner similar to a sieve, or pervaded by microscopically fine channels typically having a hole spacing of approximately 10 µm and a diameter of approximately 6-8 µm. The plate has a thickness of a few tenths of a millimeter and the channels are tilted by approximately 10° relative to the plate axis, such that the incident electrons definitely impinge on the channel wall repeatedly. They are then accelerated by an electrical voltage present between the plates along the channels and are multiplied upon each wall impact. Each individual channel thus behaves like a microscopic electron multiplier such as is used in a photomultiplier, for example.

At the exit side, the number of electrons has increased by approximately 1000-fold as a result of multiple impacts with the channel wall. Through a post-acceleration section, the amplified (=multiplied) electrons are directed onto the actual detector, usually a luminescent screen, but also for example an ebCCD, i.e. electron bombarded CCD, a special form of the CCD for detecting free electrons, and also onto an electron trap, e.g. embodied as a Faraday detector.

Microchannel plates are used in various measuring systems such as mass spectrometers, electron multipliers and night vision systems for amplifying small "primary" electron or ion currents. If primary beams (electrons, ions, photons) occur on very small cross sections at precisely defined locations, as is applicable in particular in applications in microsystems engineering or integrated optics and microoptics, the channels of the microchannel plates have to be aligned with respect thereto with an accuracy in the micrometers range.

For such applications it would be advantageous if this microchannel plate integrated in hybrid fashion could be used in a guide oriented directly with respect to the primary beam structure.

In addition to the alignment with respect to the ion channel with micrometer accuracy, it would be advantageous for the holding device to simultaneously fix the microchannel plate at this location and make electrical contact with it. In the case of the example described, an electron trap is furthermore necessary and it must be ensured that electric fields resulting from the high voltage at the plate are shielded in such a way that they do not influence the function of the microsystem, e.g. that of a mass spectrometer.

The orientation of components is of great importance in the production of microoptical systems, too. The fundamental nature of light dictates that light-generating, -transmitting and -altering components have to be positioned precisely with respect to one another. Mounting devices and fixtures in microoptical are generally restricted to mechanical structures that predominantly serve for the precise positioning of the components. They preferably use structures which are introduced into silicon substrates and on which different components (e.g. optical fiber, laser and detector diodes) are integrated in a manner aligned with respect to one another, or metallic, preferably circular, structures composed of solder, so-called bumps, which permit alignment during the solder reflow process.

Connection by soldering and laser welding are two conventional securing and mounting techniques in microsystems engineering. In the case of laser welding, by way of example, the component to be secured can be held in a clamp, which is then oriented and welded to a substrate. What is disadvantageous is, inter alia, that the component is irreversibly connected to a substrate; it is not possible to exchange the component.

EP1230571B1 describes a device for active optical fiber orientation with a plastically deformable holding device, which, however, does not include any electrical contact-connection.

EP1345843B1 describes a device for securing totally released microcomponents, which, however, does not enable a component to be mounted in a self-aligning fashion.

Therefore, proceeding from the prior art described, the object formulated is that of providing a fixture for the integration of components in MEMS which enables the component to be mounted in a self-aligning fashion. The fixture sought is intended to enable a reversible connection between the component and a substrate. Electrical contact-connection is intended to be effected in addition to the mechanical fixing of the component. The fixture is intended to be cost-effective to produce and flexible and simple to handle.

Surprisingly, it has been found that this object can be achieved particularly effectively by means of conductive spring structures that are constructed on a non-conductive substrate.

BRIEF SUMMARY OF THE INVENTION

Therefore, the present invention relates to a device for the self-aligning mounting and fixture of a component in a microsystem, characterized by at least one conductive spring structure for aligning, fixing and making contact with the component, and at least one stop against which the component is pushed, the spring structure and stop being applied on a non-conductive substrate.

The device according to the invention, also called fixture hereinafter, is suitable preferably but not exclusively for the integration of components in a hybrid microsystem. Microsystem is understood generally to mean an arrangement of structures and/or components having dimensions in the micrometers range, the structures and/or components cooperating as a system. A hybrid microsystem is understood to mean a microsystem having components which were fabricated in separate production methods and connected/joined together to form a complete system.

The fixture according to the invention achieves the complex object of the self-aligning mounting, fixture and electrical contact-connection of a component in a single structure, which is preferably produced in the same production process and thus in the same mask plane as some of the microsystem structures.

The fixture according to the invention has at least one spring structure. A spring structure is understood to mean a projection which is in a rest position and can be deflected from said rest position by an external force, the external force being counteracted by a spring force of the projection which, upon the external force being discontinued, ensures that the projection returns to the rest position again in a reversible manner.

The spring structure ensures, inter alia, that the component which is intended to be mounted and fixed to a substrate is fixed in a defined position. As a result of the introduction of the component into the fixture according to the invention, the spring structure is deflected from its rest position and exhibits a spring force on the component, such that the component is brought to a defined position. Furthermore, the spring structure is fabricated from a conductive material or provided with a conductive material. According to the invention, the mechanical contact between the component and the spring simultaneously constitutes an electrical contact.

Furthermore, the fixture according to the invention has at least one stop against which the component is pushed and/or pressed and which constitutes a delimitation. During the connection to a substrate, the component is pushed and/or pressed against at least one stop, such that the stop constitutes a barrier for the further displacement of the component and defines the position of the fixed component at least in one dimension.

According to the invention, the at least one spring structure and the at least one stop are applied on a non-conductive substrate. A substrate is understood generally to mean a part of the microsystem on which structures of the microsystem are fitted or applied or are connected to the components of the microsystem. A non-conductive material is understood to mean a material having an electrical conductivity of typically less than $10^{-7}$ S/m. By way of example, plastic, glass, ceramic or a composite material is used as the non-conductive material.

In one preferred embodiment, conductor tracks are applied on the non-conductive substrate, and permit electrical contact to be made with the at least one conductive spring structure.

In one preferred embodiment, the structures which form the fixture have been produced together with at least a portion of the structures of the microsystem, e.g. of a micro mass spectrometer.

The production of structures in microsystems is known to the person skilled in the art of microsystems engineering. Microfabrication techniques are described and illustrated e.g. in the book "Fundamentals of Microfabrication" by Marc Madou, CRC Press Boca Raton Fla. 1997 or in the book "Mikrosystemtechnik für Ingenieure" by W. Menz. J. Mohr and O. Paul, Wiley-VCH, Weinheim 2005.

The technologies of microsystems engineering are crucially based on the patterning of silicon substrates with a high aspect ratio (e.g. narrow trenches (~μm) having a large depth (~100 μm)) with structure accuracies in the micrometers range by means of wet-chemical, preferably plasma etching processes combined with sodium-containing glass substrates (e.g. Pyrex®) matched in terms of the coefficient of thermal expansion, which are provided with simple etched structures and are connected to one another hermetically tightly preferably by means of so-called anodic bonding directly, alternatively with a thin Au layer functioning as a solder alloy (AuSi).

Metallic structures with a high aspect ratio can be realized by electrolytic growth in thick photoresists (>100 μm) with comparable accuracy (UV LIGA). Using thin-film technologies such as high-vacuum evaporation and cathode sputtering, PVD processes or chemical vapor deposition (CVD processes) preferably in plasma in combination with photolithography and etching techniques, it is possible to integrate on these substrates functional layers such as metallizations, hydrophobic or hydrophilic surfaces and functional elements such as valve seals and membranes, heating elements, temperature, pressure and flow sensors in a fully process-compatible technology. By using carbon nanotubes that preferably undergo self-assembly in defined regions in deposition or patterning processes, but also silicon needles or metal cluster structures, it is possible to integrate functions based on these nanostructures into microsystems.

The structures of the fixture according to the invention (spring structure, stop), like many microsystems, are preferably produced using a silicon-glass technology. They are preferably produced together with at least a portion of the structures of the microsystem, e.g. of a micro mass spectrometer or of a fiber fixture, by conductor track structures for different contact-connections (e.g. for the conductive spring structures) firstly being applied to the non-conductive substrate. A highly doped semiconductor substrate, preferably silicon, having a thickness of preferably a few 100 μm, is bonded thereon locally in the region of the electrodes, preferably by eutectic bonding, from which the structures are patterned through to the non-conductive substrate in a subsequent photo-etching process. As an alternative, these conductive structures can also be produced by an electrolytic construction of metal in correspondingly patterned resists having a sufficient thickness of preferably a few 100 μm. The overall system can be covered, if appropriate, with a further non-conductive substrate.

The fixture according to the invention is suitable particularly for the integration of a microchannel plate in a hybrid microsystem, e.g. for the production of a micro mass spectrometer. Therefore, the present invention also relates to the use of the fixture according to the invention for accommodating and fixing and making electrical contact with a microchannel plate.

The present invention furthermore relates to a device, at least comprising a fixture according to the invention and a microchannel plate. Such a device according to the invention comprises, in addition to the microchannel plate, the following elements:

structures composed of a conductive material for accommodating a microchannel plate, which are applied on a non-conductive carrier,
resilient structures that position the microchannel plate in a self-aligning manner and simultaneously perform electrical contact-connection,
at least one stop for positioning the microchannel plate.
In addition, the device preferably comprises
at least one shielding electrode for shielding the remaining components of a microsystem from the high voltage, and/or
an electron trap, which is preferably shielded with at least one shielding electrode.

In one preferred embodiment, all the elements mentioned have been produced by photolithography in the same mask plane. Preferably, conductor tracks are present on the substrate, and enable electrical contact to be made with the elements.

The device described is very well suited to amplifying primary beams (electrons, ions, photons) in microsystems. It is suitable, therefore, e.g. for use in mass spectrometers, electron multipliers, night vision systems, photomultipliers, geiger counters, radiation dosimeters and other comparable measuring systems.

The present invention relates, in particular, to the use of the fixture according to the invention and of the device according to the invention comprising at least one microchannel plate and a fixture according to the invention in a micro mass spectrometer, electron multiplier, night vision system, photomultiplier, particle counter or radiation dosimeter. The fixture and the device are particularly preferably used in a micro mass spectrometer.

The invention is explained in more detail below on the basis of figures and examples, but without being restricted thereto.

BRIEF DESCRIPTION OF THE DRAWINGS

FIG. 2(a) shows a cross section through the connecting line at the points A and A' in FIG. 2(a).
FIG. 4(a) shows an embodiment in plain view, comprising a fixture and a micro channel plate.

DETAILED DESCRIPTION OF THE INVENTION

Figure 1:
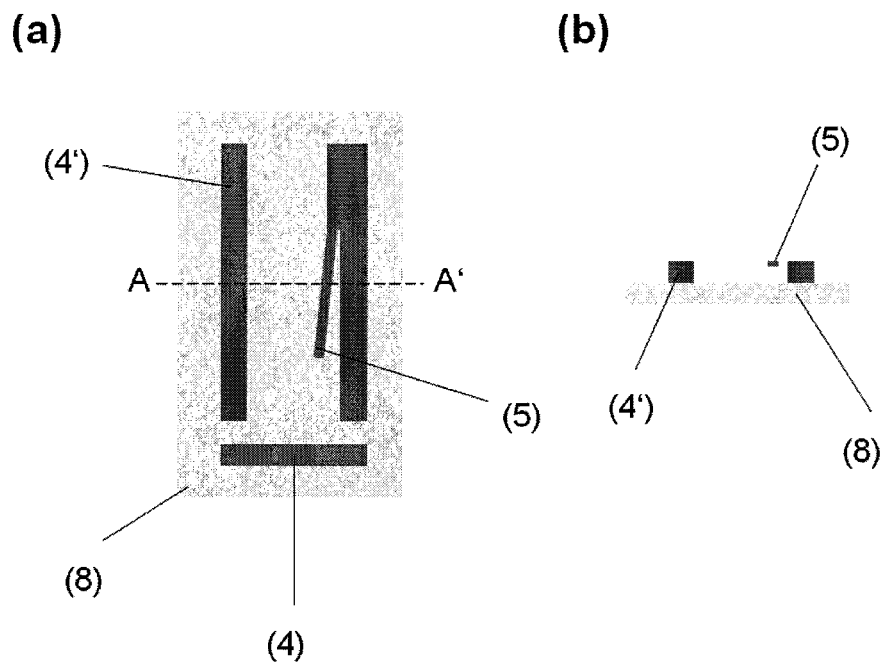
FIG. 1(a) shows a plain view of a simple embodiment of the fixture.
FIG. 1(b) shows a cross section through a connecting line through the points A and A' of FIG. 1(a).

FIG. 1 shows a schematic illustration of a simple embodiment of the fixture according to the invention (a) in plan view, (b) in cross section through the connecting line through the points A and A' in FIG. 1(a).

The embodiment shown has two stops (4, 4') and a spring structure (5), which are applied on a non-conductive substrate (8), an excerpt from which is shown here. A component can be introduced from above in FIG. 1(a) into the region between the stop (4') and the spring structure (5). The component is pressed against the stop (4') in the course of being pushed in by the spring structure and its position in this dimension is defined. The component is pushed into the fixture until it extends against the stop (4). Said stop (4) limits the displacement in a further dimension. The component is prevented from slipping out by the spring force of the spring structure (5). The component can, however, be removed in a reversible manner.

Figure 2:
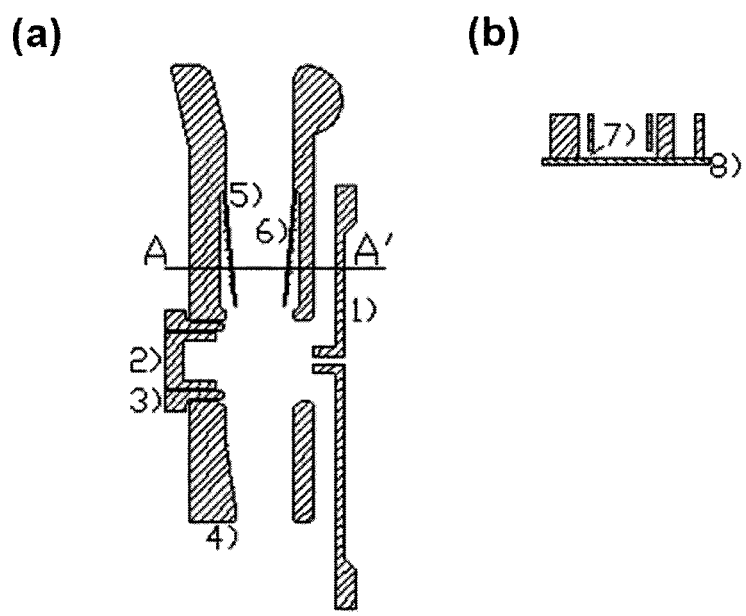
FIG. 2 shows a preferred embodiment of the fixture for the self-aligning mounting in plan view.

FIG. 2 schematically shows a preferred embodiment of the fixture according to the invention for the self-aligning mounting, fixing and electrical contact-connection of a microchannel plate in a microsystem. FIG. 2(a) shows the preferred embodiment in plan view; FIG. 2(b) shows it in cross section through the connecting line at the points A and A' in FIG. 2(a).

The fixture according to the invention comprises conductive structures (1)-(7) applied on a non-conductive substrate (8). The shield (1) prevents high electric fields from influencing the measuring system. The ion trap (2) is provided with a further shielding electrode (3), which prevents compensating currents from influencing the electron measurement if the electron trap (2) is at a positive voltage with respect to the spring structures (5), (6) in order to reliably trap the electrons. The mechanical stop (4) for the microchannel plate is embodied as a wedge-shaped guide. The spring structures (5) and (6) converge in a funnel-shaped manner in order to guide the microchannel plate and to fix it between detector electrode (2) and entrance opening for the primary beam (10). The spring structures serve as a guide and equally provide a microchannel plate with the necessary mechanical support. They are composed of a conductive material (e.g. doped silicon), such that they make contact with a microchannel plate on both sides. The spring structures are self-supporting and not connected to the non-conductive substrate, in order to ensure that they yield upon insertion of a microchannel plate and equally exert a sufficient force on the microchannel plate in order to fix the latter. In the embodiment shown, the structures forming the spring structures (5, 6), the stop (4), the shield (1), the ion trap (2) and the further shielding electrode (3) have been produced in one production process together with further structures of the microsystem (e.g. micro mass spectrometer). Examples of micro mass spectrometers and the methods for the production thereof, which can also be employed for producing the fixture according to the invention, may be found in the articles "*Mass spectra measure by a fully integrated MEMS mass spectrometer*" by J.-P. Hauschild, E. Wapelhorst and J. Müller, published in *International Journal of Mass Spectrometry* 264 (2007) 53-60 (see primarily section 3 Fabrication) and "*Complex MEMS: A fully integrated TOF micro mass spectrometer*" published in *Sensors and Actuators A: Physical,* 138 (1) (2007), 22-27 (see primarily section 3 Fabrication).

Figure 3:
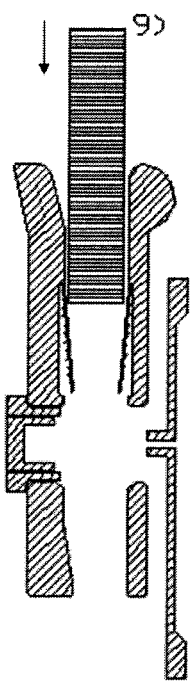
FIG. 3 shows an insertion of a micro channel plate (9) into the fixture.

FIG. 3 schematically shows how a microchannel plate (9) is inserted into the fixture according to the invention from FIG. 2. The arrow shows the direction of movement of the microchannel plate (9) during insertion.

Figure 4:
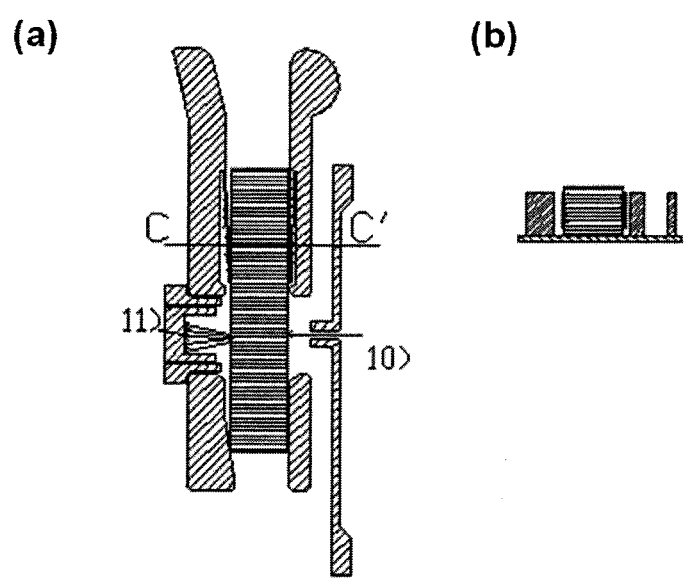
FIG. 4 (b) shows a cross section through the connecting line between the points C and C' in FIG. 4(a).

FIG. 4 shows a device according to the invention, comprising a fixture and a microchannel plate (a) in plan view, (b) in cross section through the connecting line between the points C and C' in FIG. 4(*a*). The microchannel plate that is pushed into the fixture in FIG. 3 has reached its end point in FIG. 4. By means of the spring structures and the stop, the microchannel plate is fixed in a self-aligning fashion. The electrically conductive spring structures additionally impart an electrical contact.

During operation, the incident primary beam (10) (electrons, ions, photons), passes through a diaphragm in the shield (1) and impinges on the microchannel plate (9). The electrons (11) emerging from the channel plate are trapped by the electron trap.

Figure 5:
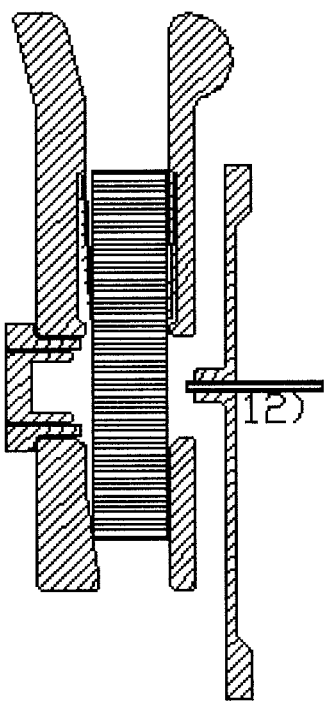
FIG. 5 shows an alternative embodiment of the fixture with a micro channel plate.

FIG. 5 schematically shows an alternative embodiment of the device according to the invention comprising a fixture and a microchannel plate, in which an optical fiber (12) is guided through the shield, such that the microchannel plate acts as an optical detector.

Figure 6:
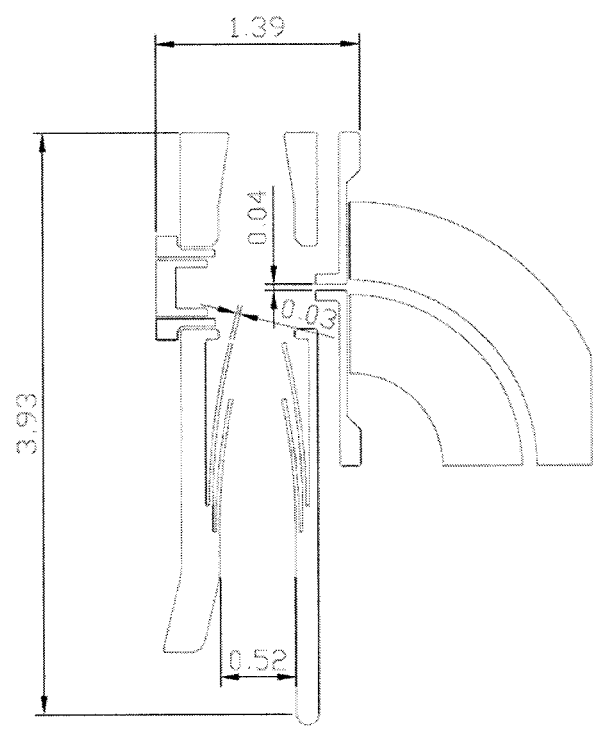
FIG. 6 shows a further embodiment of the fixture, suitable for accommodating a micro channel plate.

FIG. 6 shows a further embodiment of the fixture according to the invention, which is particularly suitable for accommodating a microchannel plate. The structures that are applied on glass as a non-conductive substrate are composed of doped silicon. The fixture is integrated on a chip of a micro mass spectrometer in accordance with the article in *Sensors and Actuators A: Physical,* 138 (1) (2007), pages 22-27, and was produced together with the remaining structures of the mass spectrometer. The key process for production is the transfer of the structure by means of photolithography and subsequent dry-chemical etching of the structures (Bosch process, see e.g. "Mikrosystemtechnik fair Ingenieure" by W. Menz. J. Mohr and O. Paul, Wiley-VCH, Weinheim 2005). The numbers indicate the dimensions of the structures in mm. As can be seen from the figure, in each case two spring structures were fitted to the opposite sides of the opening in the fixture. The opening (the microchannel plate is inserted from below in the fixture shown in FIG. 6) has a funnel-shaped course in order to be able to better guide the microchannel plate and to facilitate insertion.

In principle, all commercially available microchannel plates can be inserted into the fixture according to the invention; if appropriate, they may need to be tailored to the size of 2×0.6 mm that can be used here. By way of example, the microchannel plate having the designation G10-2x0.6/ST/6 from Photonics can be used.

The invention claimed is:

1. A device for self-aligning mounting and affixing of a microchannel plate in a micro system, comprising:
at least one conductive spring structure, formed to accept a microchannel plate, for aligning, fixing and making electrical contact with the microchannel plate when the microchannel plate is affixed to the micro system, wherein the at least one conductive spring mechanically supports the microchannel plate when the microchannel plate is affixed in the micro system, and
at least one stop against which the microchannel plate is pushed or pressed when affixed in the micro system by the at least one conductive spring structure,
wherein the at least one conductive spring structure and the at least one stop are conductive structures being applied on a non-conductive substrate, and
further wherein the micro system is one selected from the group consisting of a micro mass spectrometer, an electron multiplier, a photomultiplier, a particle counter and a radiation dosimeter;
further comprising conductor tracks for making electrical contact with the at least one conductive spring structure, the conductor tracks are applied on the non-conductive substrate.

2. The device according to claim 1, wherein the at least one conductive spring structure and the at least one stop were produced by photolithography in the same mask plane as the micro system structures.

3. The device according to claim 1, wherein the at least one conductive spring structure is produced by a photo-etching process.

4. The device according to claim 1, wherein the at least one conductive spring structure is composed of doped silicon.

5. The device according to claim 1, wherein the at least one conductive spring structure is produced by electrolytic molding in a photoresist.

6. The device according to claim 1, wherein the non-conductive substrate is glass.

7. The device according to claim 1, further comprising at least one shielding electrode for protecting the micro system against influences of a high voltage at the microchannel plate when the microchannel plate is affixed in the micro system.

8. The device according to claim 1, wherein the at least one stop directly contacts the non-conductive substrate.

9. The device according to claim 1, wherein the at least one conductive spring structure is a resilient structure and is composed of a projection that is movable from a rest position to a deflected position when the projection is deflected from the rest position by an external force, that is counteracted by a spring force of the projection.

10. The device according to claim 3, wherein the photo-etching process is effected in a doped semiconductor material.

11. The device according to claim 7, further comprising an electron trap.

12. The device according to claim 7, wherein all structures of the device were produced by photolithography in a same mask plane.

13. A method for providing a device for the self-aligning mounting and affixing of a microchannel plate in a micro system, comprising the steps of:

providing at least one conductive spring structure formed to accept a microchannel plate, for aligning, fixing and making contact with the microchannel plate, pushing or pressing the microchannel plate against at least one stop, wherein the at least one conductive spring structure mechanically supports the microchannel plate when the microchannel plate is affixed in the micro system, wherein the microchannel plate is an optical detector, an electron multiplier or an ion multiplier, and applying the at least one conductive spring structure and the at least one stop on a non-conductive substrate, wherein the at least one conductive spring structure and the at least one stop are conductive structures;

further comprising conductor tracks for making electrical contact with the at least one conductive spring structure, the conductor tracks are applied on the non-conductive substrate.

14. The method of providing the device according to claim 13, wherein the micro system is one of a micro mass spectrometer, an electron multiplier, a night vision system, a photomultiplier, a particle counter or a radiation dosimeter.

15. A device for self-aligning mounting and affixing of a microchannel plate in a micro system, comprising:

at least one conductive spring structure, formed to accept a microchannel plate, for aligning, fixing and making electrical contact with the microchannel plate when the microchannel plate is affixed to the micro system, wherein the electrical contact is made on both sides of the microchannel plate, wherein the at least one conductive spring mechanically supports the microchannel plate when the microchannel plate is affixed in the micro system, and at least one stop against which the microchannel plate is pushed or pressed when affixed in the micro system by the at least one conductive spring structure, wherein the at least one conductive spring structure and the at least one stop are conductive structures being applied on a non-conductive substrate;

further comprising conductor tracks for making electrical contact with the at least one conductive spring structure, the conductor tracks are applied on the non-conductive substrate.

* * * * *